US009793248B2

(12) United States Patent
Lai et al.

(10) Patent No.: US 9,793,248 B2
(45) Date of Patent: Oct. 17, 2017

(54) LIGHT EMITTING DEVICE

(71) Applicant: PlayNitride Inc., Tainan (TW)

(72) Inventors: Yu-Hung Lai, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/938,843

(22) Filed: Nov. 12, 2015

(65) Prior Publication Data

US 2016/0141278 A1    May 19, 2016

Related U.S. Application Data

(60) Provisional application No. 62/081,503, filed on Nov. 18, 2014, provisional application No. 62/092,265, filed on Dec. 16, 2014.

(30) Foreign Application Priority Data

Oct. 21, 2015 (TW) .............................. 104134510 A

(51) Int. Cl.
  *H01L 25/075*   (2006.01)
  *H01L 33/06*    (2010.01)
  *H01L 33/62*    (2010.01)
  *H01L 33/46*    (2010.01)
  *H01L 33/02*    (2010.01)

(52) U.S. Cl.
  CPC .......... *H01L 25/0753* (2013.01); *H01L 33/62* (2013.01); *H01L 2924/0002* (2013.01)

(58) Field of Classification Search
  USPC .......................................................... 257/13
  See application file for complete search history.

(56) References Cited

U.S. PATENT DOCUMENTS

| 2011/0062440 | A1* | 3/2011 | Adekore | C30B 25/18 257/43 |
| 2011/0254039 | A1* | 10/2011 | Kim | H01L 33/46 257/98 |
| 2013/0037603 | A1* | 2/2013 | Choi | H01L 23/49816 228/203 |
| 2013/0099380 | A1* | 4/2013 | Chen | H01L 24/11 257/738 |
| 2013/0214302 | A1* | 8/2013 | Yeh | H01L 33/48 257/88 |
| 2015/0163908 | A1* | 6/2015 | Wang | H05K 1/113 174/257 |
| 2016/0093770 | A1* | 3/2016 | Shen | H01L 33/02 257/94 |

\* cited by examiner

*Primary Examiner* — Zandra Smith
*Assistant Examiner* — Lawrence Tynes, Jr.
(74) *Attorney, Agent, or Firm* — Jianq Chyun IP Office

(57) ABSTRACT

A light emitting device includes a substrate, a plurality of micro light emitting chips and a plurality of conductive bumps. The substrate has a plurality of pads. The micro light emitting chips are disposed on the substrate in dispersion. Each of the micro light emitting chips includes an N-type semiconductor layer, an active layer and a P-type semiconductor layer. The conductive bumps are disposed corresponding to the micro light emitting chips and located between the micro light emitting chips and the substrate. The micro light emitting chips are electrically connected to the pads of the substrate by the conductive bumps. An orthogonal projection area of each of the conductive bumps on the substrate is greater than an orthogonal projection area of each of the micro light emitting chips on the substrate.

13 Claims, 6 Drawing Sheets

LIGHT EMITTING DEVICE

CROSS-REFERENCE TO RELATED APPLICATION

This application claims the priority benefits of U.S. provisional application Ser. No. 62/081,503, filed on Nov. 18, 2014, U.S. provisional application Ser. No. 62/092,265, filed on Dec. 16, 2014 and Taiwan application serial no. 104134510, filed on Oct. 21, 2015. The entirety of each of the above-mentioned patent applications is hereby incorporated by reference herein and made a part of this specification.

BACKGROUND OF THE INVENTION

1. Field of the Invention

The present invention relates to a semiconductor device, and relates particularly to a light emitting device.

2. Description of Related Art

Generally speaking, a light emitting diode chip may be electrically connected with an external circuit by a wire bonding or a flip-chip bonding method. In the flip-chip bonding connection method, the electrodes of the light emitting diode chip may be electrically connected with the pads on the external circuit by the conductive bumps, the conductive paste, the solder and such conductive material. Wherein, a contact area of the conductive bumps or the solder with the light emitting diode chip is lesser than an area of the light emitting diode chip, therefore there is not an adequate alignment margin between the conductive bumps or the solder with the pads of the external circuit, consequently lowering the alignment precision between the light emitting diode chip and the external circuit.

SUMMARY OF THE INVENTION

The invention provides a light emitting device having better alignment precision between micro light emitting chips and a substrate.

A light emitting device of the invention includes a substrate, a plurality of micro light emitting chips and a plurality of conductive bumps. The substrate has a plurality of pads. The micro light emitting chips are disposed on the substrate in dispersion. Each of the micro light emitting chips includes an N-type semiconductor layer, an active layer and a P-type semiconductor layer. The conductive bumps are disposed corresponding to the micro light emitting chips and located between the micro light emitting chips and the substrate. The micro light emitting chips are electrically connected to the pads of the substrate by the conductive bumps. An orthogonal projection area of each of the conductive bumps on the substrate is greater than an orthogonal projection area of each of the micro light emitting chips on the substrate.

In an embodiment of the invention, a thickness of each of the conductive bumps is greater than a thickness of each of the micro light emitting chips.

In an embodiment of the invention, the micro light emitting chips have different thicknesses.

In an embodiment of the invention, the active layers of the micro light emitting chips have similar height levels and the N-type semiconductor layers of the micro light emitting chips have different thicknesses.

In an embodiment of the invention, the micro light emitting chips include at least one vertical type red color light emitting chip, at least one vertical type green color light emitting chip and at least one vertical type blue color light emitting chip.

In an embodiment of the invention, the conductive bumps have different thicknesses.

In an embodiment of the invention, the orthogonal projection area of the conductive bumps on the substrate is directly proportional with the thickness of the conductive bumps.

In an embodiment of the invention, each of the conductive bumps includes at least two metal layers, a melting point of the metal layer that is closer to the pads is lower than a melting point of the other metal layer that is closer to the micro light emitting chips.

In an embodiment of the invention, each of the conductive bumps includes at least one gold layer and at least one alloy layer located on the gold layer, each of the pads at least includes a copper layer and an indium layer located on the copper layer, and the gold layer of each of the conductive bumps directly contacts the indium layer of each of the pads.

In an embodiment of the invention, a thickness of the gold layer is greater than a thickness of the alloy layer.

In an embodiment of the invention, each of the conductive bumps further includes a reflective material layer disposed between the corresponding micro light emitting chip and the alloy layer.

In an embodiment of the invention, the orthogonal projection area each of the conductive bumps on the substrate is 1.05 times to 1.5 times of the orthogonal projection area of each of the micro light emitting chips on the substrate.

In an embodiment of the invention, a maximum peak current density value of an external quantum efficiency curve of each of the micro light emitting chips is between 0.01 A/cm$^2$ to 2 A/cm$^2$.

In an embodiment of the invention, a defect density of each of the micro light emitting chips is between 10$^4$/cm$^2$ to 10$^8$/cm$^2$.

Based on the above, since the orthogonal projection area of each of the conductive bumps of the light emitting device of the invention on the substrate is greater than the orthogonal projection area of each of the micro light emitting chips on the substrate, namely, the orthogonal projection area of the conductive bumps is greater than the contact area between the micro light emitting chips and the conductive bumps. Therefore, there may be a larger alignment margin between the conductive bumps and the pads of the substrate, consequently aiding in increasing the alignment precision between the micro light emitting chips and the substrate.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
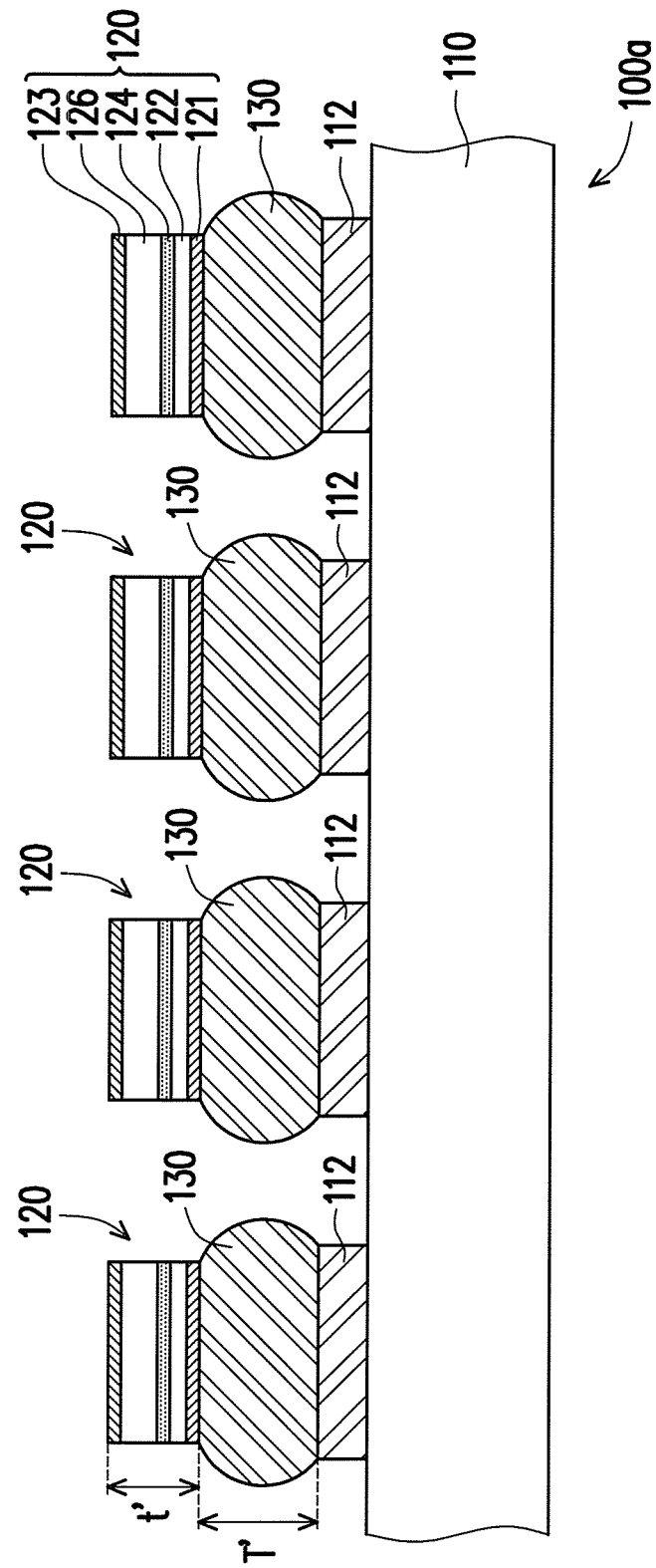
FIG. 1 is a cross-sectional schematic diagram illustrating a light emitting device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts. FIG. 1 is a cross-sectional schematic diagram illustrating a light emitting device according to an embodiment of the invention. Referring to FIG. 1, in the present embodiment, a light emitting device 100a includes a substrate 110, a plurality of micro light emitting chips 120 and a plurality of conductive bumps 130. The substrate 110 has a plurality of pads 112. The micro light emitting chips 120 are disposed on the substrate 110 in dispersion, wherein each of the micro light emitting chips 120 includes a P-type semiconductor layer 122, an active layer 124 and an N-type semiconductor layer 126. The conductive bumps 130 are disposed corresponding to the micro light emitting chips 120 and located between the micro light emitting chips 120 and the substrate 110, wherein the micro light emitting chips 120 are electrically connected to the pads 112 of the substrate 110 by the conductive bumps 130. An orthogonal projection area of each of the conductive bumps 130 on the substrate 110 is greater than an orthogonal projection area of each of the micro light emitting chips 120 on the substrate 110. Preferably, the orthogonal projection area of each of the conductive bumps 130 on the substrate 110 is 1.05 times to 1.5 times of the orthogonal projection area of each of the micro light emitting chips 120 on the substrate 110.

More specifically, the substrate 110 of the present embodiment is a driving substrate, the driving substrate for example is a circuit substrate, a display substrate, a lighting substrate, a substrate having transistors or integrated circuits (ICs) or a substrate having metal redistribution lines, however the invention is not limited thereto. As shown in FIG. 1, an orthogonal projection area of each of the pads 112 on the substrate 110 is smaller than the orthogonal projection area of each of the conductive bumps 130 on the substrate 110. It should be noted, here the pads 112 are disposed on a surface of the substrate 110, however in other embodiments not shown, the pads may be embedded in the substrate, and still be within the scope sought to be protected by the invention.

Furthermore, each of the micro light emitting chips 120 of the present embodiment further includes a first electrode 121 and a second electrode 123. The active layer 124 is located between the P-type semiconductor layer 122 and the N-type semiconductor layer 126, wherein the first electrode 121 is structurally and electrically connected to the P-type semiconductor layer 122 and the second electrode 123 is structurally and electrically connected to the N-type semiconductor layer 126. In the micro light emitting chips 120 of the present embodiment, the active layer 124 is a multiple quantum well (MQW) structure, the first electrode 121, for example, is a P electrode, and the second electrode 123, for example, is an N electrode. In the present embodiment, the P-type semiconductor layer 122 is located between the N-type semiconductor layer 126 and the conductive bump 130, however in other embodiments not shown the N-type semiconductor layer 126 may be located between the P-type semiconductor layer 122 and the conductive bump 130, the first electrode 121, for example, is an N electrode, and the second electrode 123, for example, is a P electrode and it should not be construed as a limitation to the invention. In particular, in the present embodiment, a thickness T' of the conductive bumps 130 is greater than a thickness t' of each of the micro light emitting chips 120.

As shown in FIG. 1, a thickness of the N-type semiconductor layer 126 in the present embodiment is greater than a thickness of the P-type semiconductor layer 122, wherein the thickness of the N-type semiconductor layer 126, for example, is 4 micrometers, and the thickness of the P-type semiconductor layer 122, for example, is 0.3 micrometers. Therefore, the active layer 124 is closer to the conductive bump 130 and the pad 112 of the substrate 110 such that the heat generated by the micro light emitting chips 120 may be effectively transmitted to the surrounding through the conductive bump 130 and the substrate 110, so the light emitting device 100a may have a better heat dissipation effect. Furthermore, a maximum peak current density value of an external quantum efficiency curve of each of the micro light emitting chips 120 is preferably between 0.01 A/cm$^2$ to 2 A/cm$^2$. That is to say, the micro light emitting chips 120 of the present embodiment are adapted to operate in a low current density situation. In addition, each of the micro light emitting chips 120 of the present embodiment may act as a sub-pixel in a display and the micro light emitting chips 120 of the present embodiment have different size specifications compared with current light emitting diode chips commonly used. More specifically, a side length size of a light emitting diode chip commonly used is 0.2 millimeters to 1 millimeter, however a side length size of each of the micro light emitting chips 120 of the present embodiment is 1 micrometer to 100 micrometers, and preferably the side length size of each of the micro light emitting chips 120 is 3 micrometers to 40 micrometers. In addition, an epitaxial defect density of the micro light emitting chips 120 of the present embodiment is smaller and preferably the epitaxial defect density of the micro light emitting chips 120 is between $10^4$/cm$^2$ to $10^8$/cm$^2$.

Since the orthogonal projection area of each of the conductive bumps 130 of the light emitting device 100a on the substrate 110 is greater than the orthogonal projection area of each of the micro light emitting chips 120 on the substrate 110 in the present embodiment, namely, the orthogonal projection area of the conductive bumps 130 are greater than a contact area between the micro light emitting chips 120 and the conductive bumps 130. Therefore, there may be a larger alignment margin between the conductive bumps 130 and the pads 112 of the substrate 110, consequently aiding in increasing the alignment precision between the micro light emitting chips 120 and the substrate 110.

Here, it should be noted the below embodiments adopt component notations and part of the content of the aforementioned embodiment, wherein the same notations are used for representing the same or similar components, and descriptions of the same technical content are omitted. For description regarding the omitted part, reference may be made to the aforementioned embodiment, and will not be repeated here.

Figure 2:
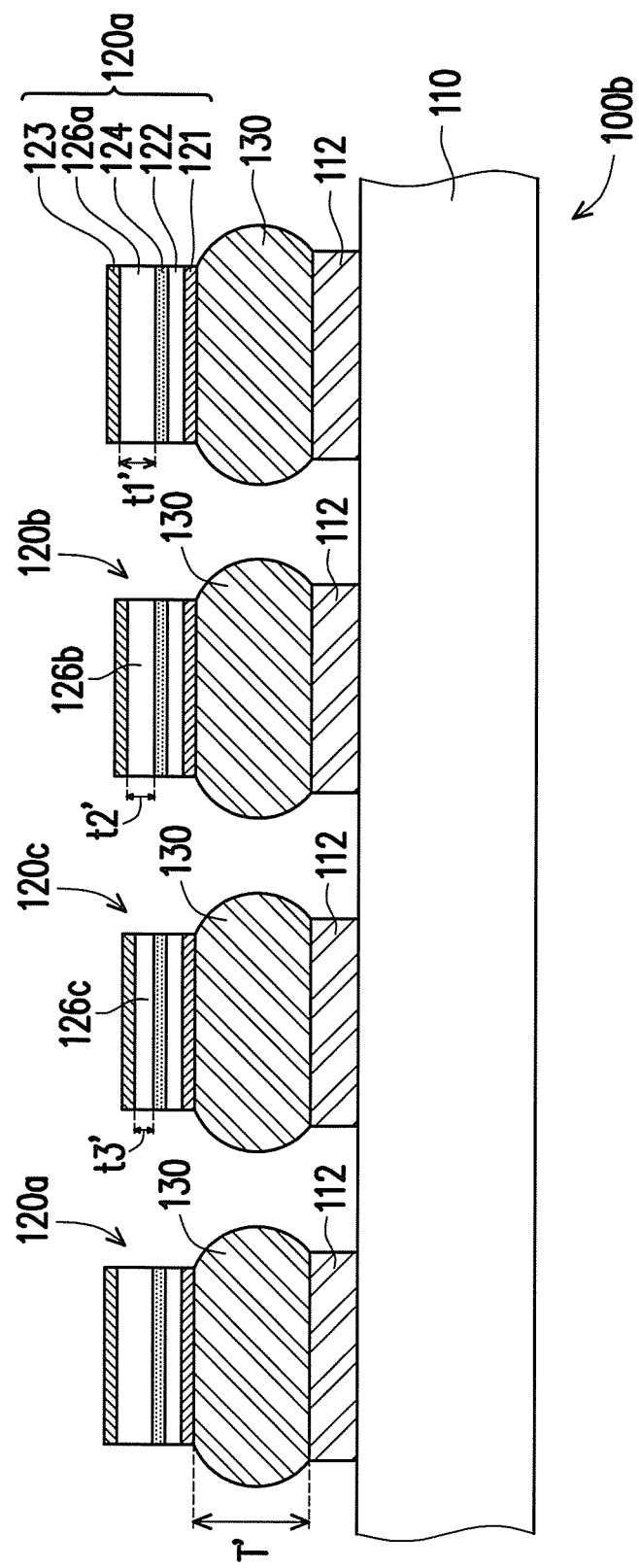
FIG. 2 is a cross-sectional schematic diagram illustrating a light emitting device according to another embodiment of the invention.

FIG. 2 is a cross-sectional schematic diagram illustrating a light emitting device according to another embodiment of the invention. Referring to FIG. 1 and FIG. 2 at the same time, a light emitting device 100b of the present embodiment and the light emitting device 100a of FIG. 1 are similar, however a main difference between the two lies in: the micro light emitting chips 120a, 120b, 120c of the light emitting device 100b in the present embodiment have different thicknesses. More specifically, the active layers 124 of the micro light emitting chips 120a, 120b, 120c have similar height levels and the N-type semiconductor layers 126a, 126b, 126c of the micro light emitting chips 120a, 120b, 120c have different thicknesses t1', t2', t3', wherein the thickness t1' of the N-type semiconductor layer 126a of the micro light emitting chip 120a is greater than the thickness t2' of the N-type semiconductor layer 126b of the micro light emitting chip 120b, and the thickness t2' of the N-type semiconductor layer 126b of the micro light emitting chip 120b is greater than the thickness t3' of the N-type semiconductor layer 126c of the micro light emitting chip 120c. Here, the micro light emitting chip 120a, for example, is a vertical type red color light emitting chip, the micro light emitting chip 120b, for example, is a vertical type blue color light emitting chip and the micro light emitting chip 120c, for example, is a vertical type green color light emitting chip.

Figure 3:
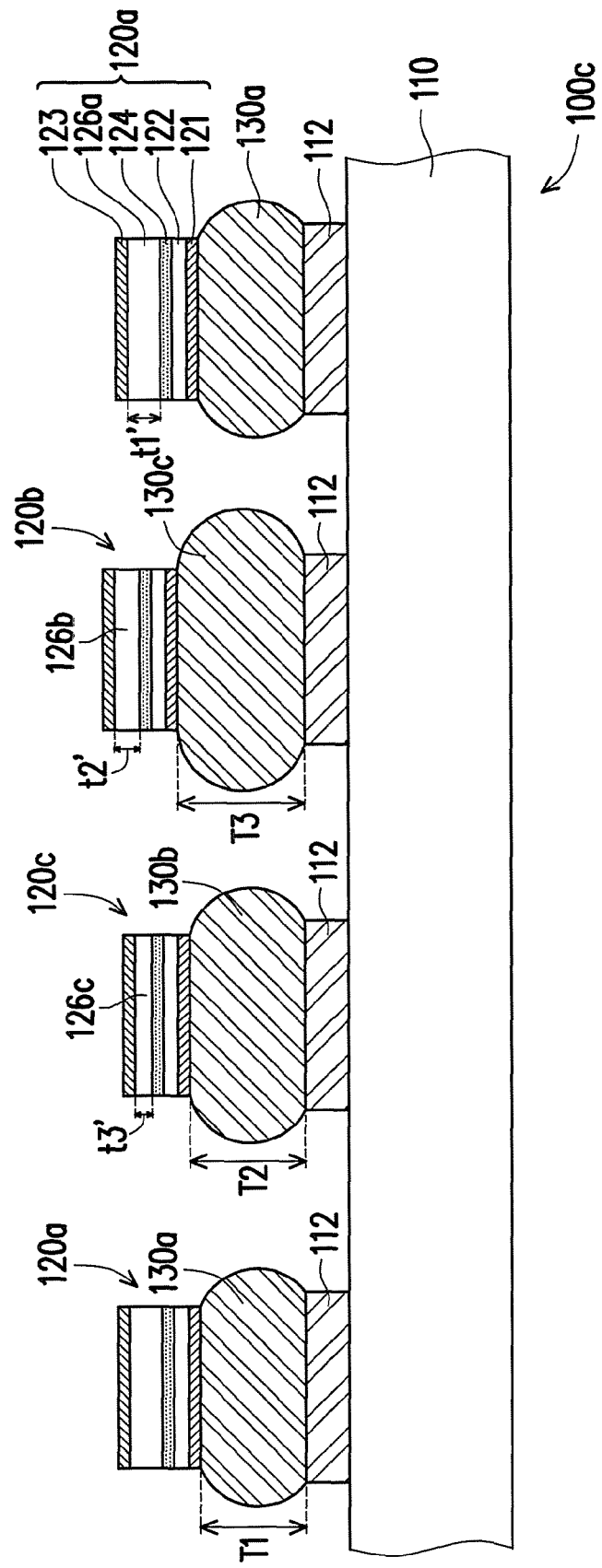
FIG. 3 is a cross-sectional schematic diagram illustrating a light emitting device according to another embodiment of the invention.

FIG. 3 is a cross-sectional schematic diagram illustrating a light emitting device according to another embodiment of the invention. Referring to FIG. 2 and FIG. 3 at the same time, a light emitting device 100c of the present embodiment and the light emitting device 100b of FIG. 2 are similar, however a main difference between the two lies in: in addition to the micro light emitting chips 120a, 120b, 120c of the light emitting device 100c of the present embodiment having different thicknesses, the conductive bumps 130a, 130b, 130c also have different thicknesses. More specifically, as shown in FIG. 3, the thickness t1' of the N-type semiconductor layer 126a of the micro light emitting chip 120a is greater than the thickness t2' of the N-type semiconductor layer 126b of the micro light emitting chip 120b, and the thickness t2' of the N-type semiconductor layer 126b of the micro light emitting chip 120b is greater than the thickness t3' of the N-type semiconductor layer 126c of the micro light emitting chip 120c, and the thicknesses T1, T2, T3 of the conductive bumps 130a, 130b, 130c are greater than the thicknesses of the micro light emitting chips 120a, 120b, 120c respectively. Preferably, the orthogonal projection area of the conductive bumps 130a, 130b, 130c on the substrate 110 is directly proportional to the thicknesses T1, T2, T3 of the conductive bumps 130a, 130b, 130c. That is to say, the greater the orthogonal projection area of the conductive bumps 130a, 130b, 130c on the substrate 110, then the thicker the thicknesses T1, T2, T3 of the conductive bumps 130a, 130b, 130c, and may effectively increase the alignment precision between the micro light emitting chips 120a, 120b, 120c and the substrate 110. Here, the thicknesses T1, T2, T3 of the conductive bumps 130a, 130b, 130c are between 2 micrometers to 10 micrometers. In the present embodiment, the P-type semiconductor layer 122 of the micro light emitting chips 120a, 120b, 120c have the same thickness, however in other embodiments not shown, the P-type semiconductor layer 122 of the micro light emitting chips 120a, 120b, 120c may have different thicknesses, and configured with conductive bumps of different thicknesses, such that the active layers 124 of the micro light emitting chips 120a, 120b, 120c have similar height levels.

Figure 4:
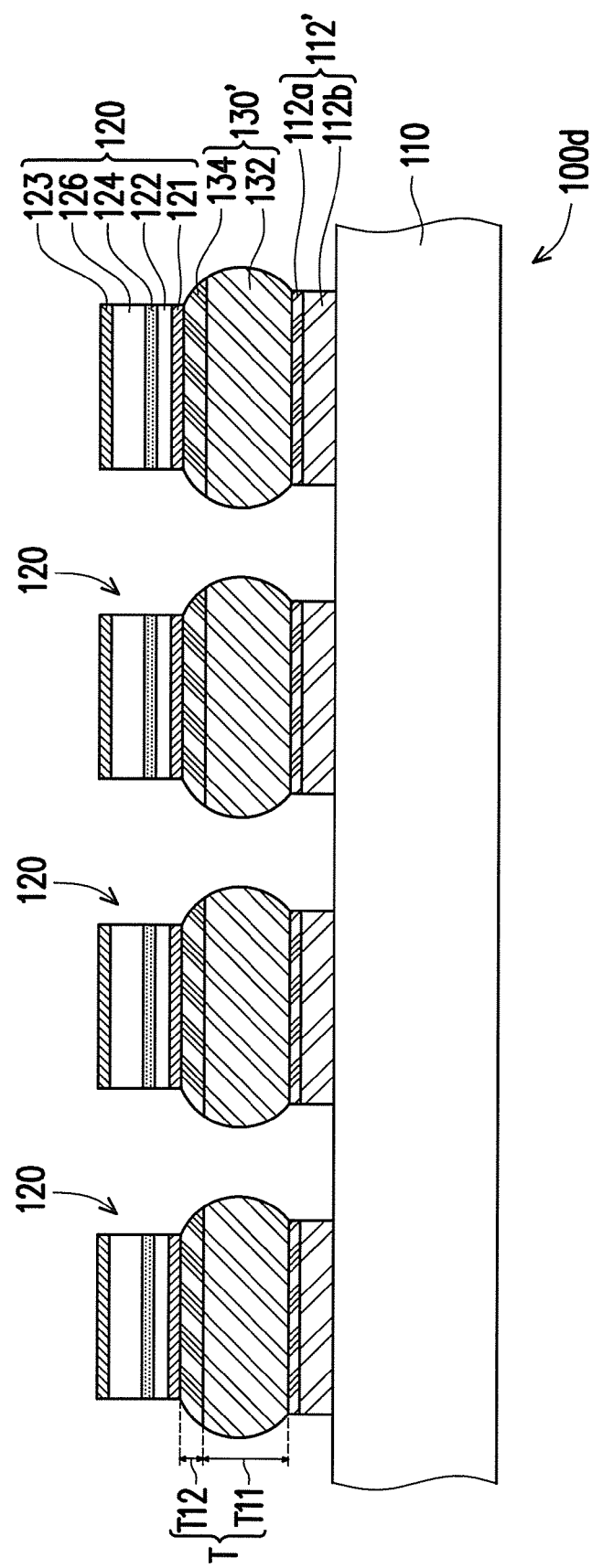
FIG. 4 is a cross-sectional schematic diagram illustrating a light emitting device according to another embodiment of the invention.

FIG. 4 is a cross-sectional schematic diagram illustrating a light emitting device according to another embodiment of the invention. Referring to FIG. 1 and FIG. 4 at the same time, a light emitting device 100d of the present embodiment and the light emitting device 100a of FIG. 1 are similar, however a main difference between the two lies in: each of the conductive bumps 130' of the light emitting device 100d of the present embodiment includes at least one gold layer 132 and at least one alloy layer 134 located on top of the gold layer 132. Each of the pads 112' at least includes a copper layer 112b and an indium layer 112a located on the copper layer 112b. The gold layer 132 of each of the conductive bumps 130' directly contacts the indium layer 112a of each of the pads 112'. Here, as shown in FIG. 4, the thickness T of the conductive bumps 130' is formed by a thickness T11 of the gold layer 132 and a thickness T12 of the alloy layer 134, wherein the thickness T11 of the gold layer 132 is greater than the thickness T12 of the alloy layer 134. The gold layer 132 and the indium layer 112a in direct contact may produce a gold-indium (AuIn) eutectic bonding, the gold-indium eutectic bonding having low thermal stress and high thermal conductivity, wherein the low thermal stress may increase the alignment precision between the micro light emitting chips 120 and the substrate 110, and the high thermal conductivity may rapidly transmit the heat of the micro light emitting chips 120 out.

Figure 5:
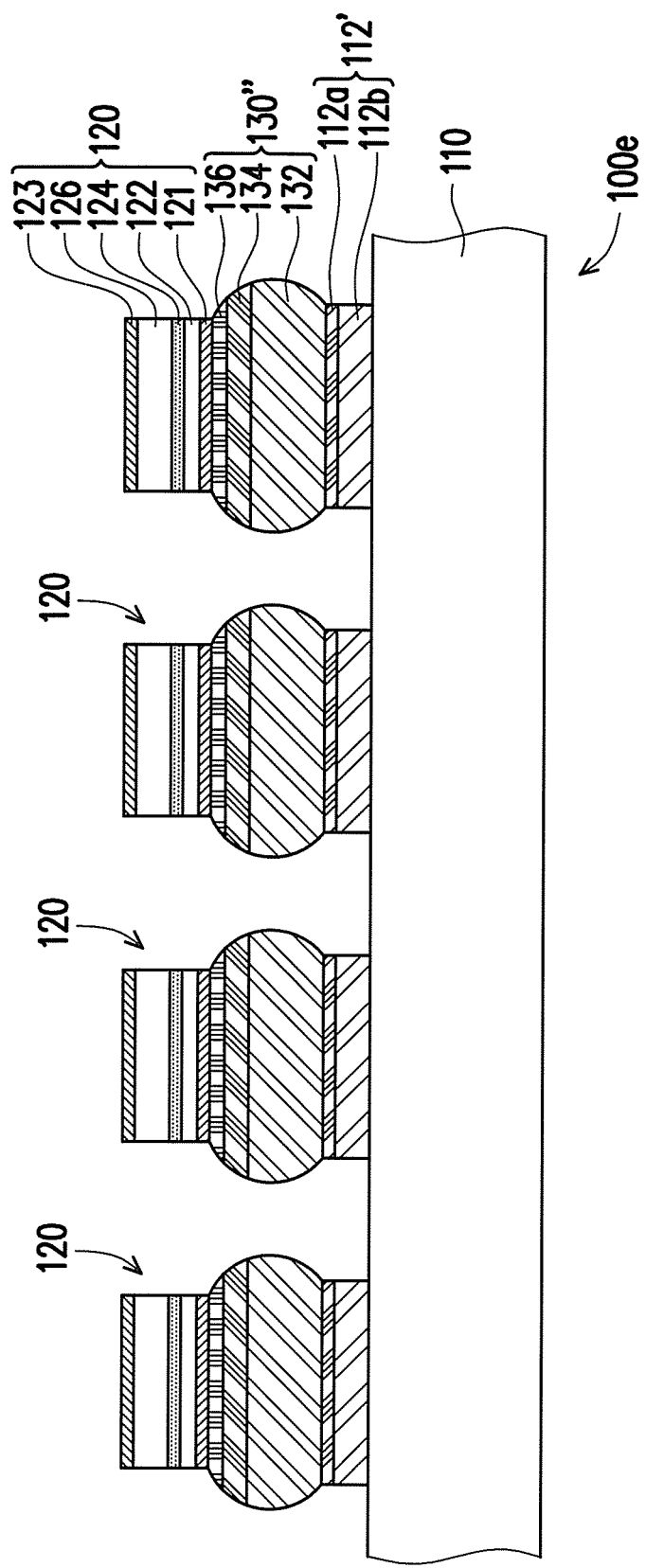
FIG. 5 is a cross-sectional schematic diagram illustrating a light emitting device according to another embodiment of the invention.

FIG. 5 is a cross-sectional schematic diagram illustrating a light emitting device according to another embodiment of the invention. Referring to FIG. 4 and FIG. 5 at the same time, a light emitting device 100e of the present embodiment and the light emitting device 100d of FIG. 4 are similar, however a main difference between the two lies in: the conductive bumps 130" of the light emitting device 100e of the present embodiment further includes a reflective material layer 136, wherein the reflective material layer 136 is disposed between the corresponding micro light emitting chip 120 and alloy layer 134. That is to say, in addition to having a conducting function, the conductive bumps 130" of the present embodiment also has a reflecting function, and may effectively increase the light emitting efficiency of the light emitting device 100e.

Figure 6:
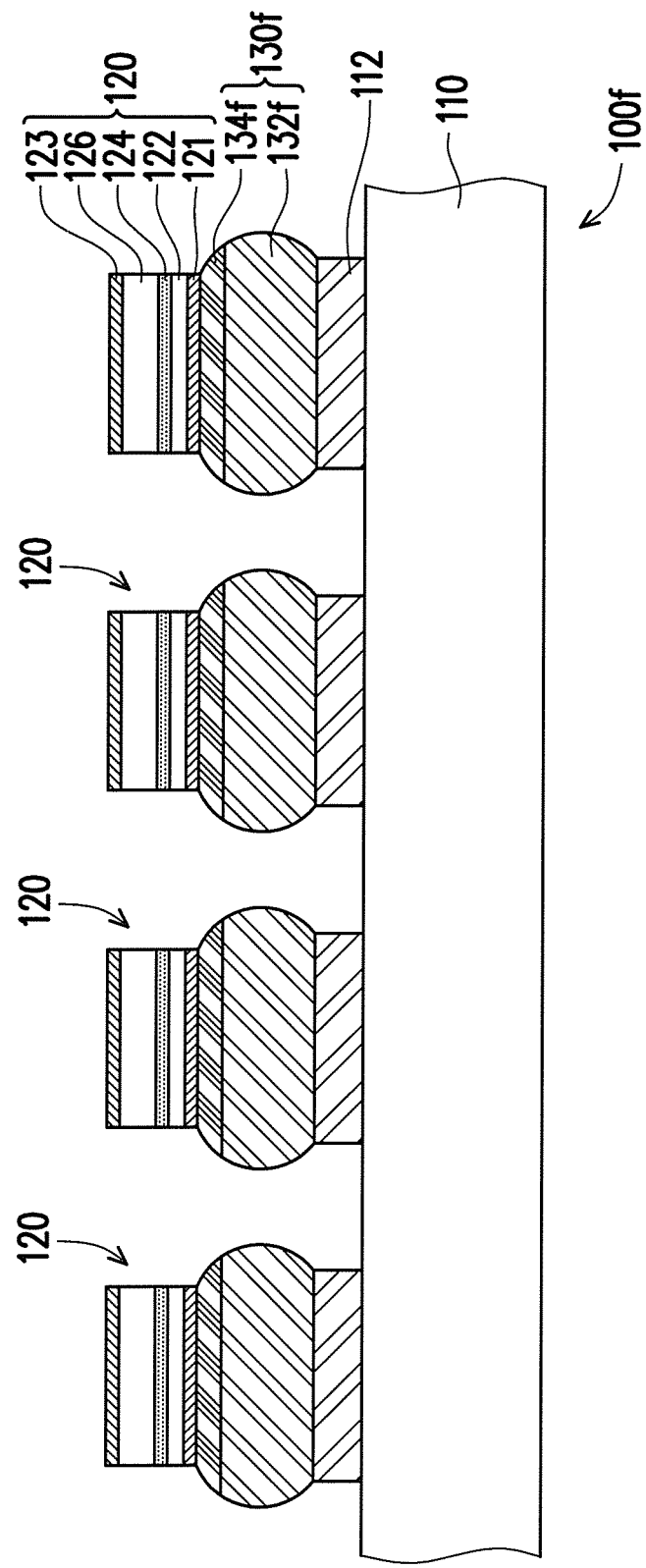
FIG. 6 is a cross-sectional schematic diagram illustrating a light emitting device according to another embodiment of the invention.

FIG. 6 is a cross-sectional schematic diagram illustrating a light emitting device according to another embodiment of the invention. Referring to FIG. 1 and FIG. 6 at the same time, a light emitting device 100f of the present embodiment and the light emitting device 100a of FIG. 1 are similar, however a main difference between the two lies in: each of the conductive bumps 130f of the light emitting device 100f of the present embodiment includes at least two metal layers 132f, 134f, wherein a melting point of the metal layer 132f that is closer to the pad 112 is lower than a melting point of the other metal layer 134f that is closer to the micro light emitting chips 120. The metal layer 132f is formed by a metal material with a lower melting point, preferably a metal with a melting point lower than 200° C., for example, tin or indium. The metal layer 134f is formed by a metal material with a higher melting point, preferably a metal with a melting point higher than 210° C., for example, gold or lead. When performing die bonding thermal compression bonding, the substrate 110 is heated to higher than the melting temperature of the metal layer 132f but lower than the melting temperature of the metal layer 134f. At this temperature, the metal layer 132f is converted to a liquid state and the metal layer 134f still maintains a solid state, wherein when the micro light emitting chips 120 and the substrate 110 are connected together, the metal layer 132f in the liquid state may lower the impact force of the contact surface so as to prevent a tilt existed by the micro light emitting chips 120. Generally speaking, the thickness of the metal layer 134f and the thickness of the metal layer 132f are not particularly limited, however when the thickness of the metal layer 132f is greater than or equal to the metal layer 134f, the effect for lowering the impact force of the contact surface is better.

In summary, since the orthogonal projection area of each of the conductive bumps of the light emitting device of the invention on the substrate is greater than the orthogonal projection area of each of the micro light emitting chips on the substrate, namely, the orthogonal projection area of the conductive bumps is greater than the contact area between the micro light emitting chips and the conductive bumps. Therefore, there may be a larger alignment margin between the conductive bumps and the pads of the substrate, consequently aiding in increasing the alignment precision between the micro light emitting chips and the substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting device, comprising:
    a substrate, having a plurality of pads;
    a plurality of micro light emitting chips, disposed on the pads of the substrate in dispersion, each of the micro light emitting chips comprises an N-type semiconductor layer, an active layer and a P-type semiconductor layer; and
    a plurality of conductive bumps, disposed corresponding to the micro light emitting chips and located between the micro light emitting chips and the substrate, and the micro light emitting chips are electrically connected to the pads of the substrate by the conductive bumps, wherein an orthogonal projection area of each of the conductive bumps on the substrate is greater than an orthogonal projection area of each of the micro light emitting chips on the substrate, wherein a width of each of the conductive bumps is larger than a width of each of the micro light emitting chips, wherein a width of each of the conductive bumps is larger than a width of each of the pads of the substrate, wherein a thickness of each of the conductive bumps is greater than a thickness of each of the micro light emitting chips.

2. The light emitting device as claimed in claim 1, wherein the micro light emitting chips have different thicknesses.

3. The light emitting device as claimed in claim 2, wherein the active layers of the micro light emitting chips have similar height levels, and the N-type semiconductor layers of the micro light emitting chips have different thicknesses.

4. The light emitting device as claimed in claim 2, wherein the micro light emitting chips comprise at least one vertical type red color light emitting chip, at least one vertical type green color light emitting chip and at least one vertical type blue color light emitting chip.

5. The light emitting device as claimed in claim 2, wherein the conductive bumps have different thicknesses.

6. The light emitting device as claimed in claim 5, wherein the orthogonal projection area of the conductive bumps on the substrate is directly proportional with the thickness of the conductive bumps.

7. The light emitting device as claimed in claim 1, wherein each of the conductive bumps comprises at least two metal layers, a melting point of the metal layer that is closer to the pads is lower than a melting point of the other metal layer that is closer to the micro light emitting chips.

8. The light emitting device as claimed in claim 1, wherein each of the conductive bumps comprises at least one gold layer and at least one alloy layer located on the gold layer, each of the pads at least comprises a copper layer and an indium layer located on the copper layer, and the gold layer of each of the conductive bumps directly contacts the indium layer of each of the pads.

9. The light emitting device as claimed in claim 8, wherein a thickness of the gold layer is greater than a thickness of the alloy layer.

10. The light emitting device as claimed in claim 8, wherein each of the conductive bumps further comprises a reflective material layer disposed between the corresponding micro light emitting chip and the alloy layer.

11. The light emitting device as claimed in claim 1, wherein the orthogonal projection area each of the conductive bumps on the substrate is 1.05 times to 1.5 times of the orthogonal projection area of each of the micro light emitting chips on the substrate.

12. The light emitting device as claimed in claim 1, wherein a maximum peak current density value of an external quantum efficiency curve of each of the micro light emitting chips is between 0.01 A/cm$^2$ to 2 A/cm$^2$.

13. The light emitting device as claimed in claim 1, wherein an epitaxial defect density of each of the micro light emitting chips is between $10^4$/cm$^2$ to $10^8$/cm$^2$.

* * * * *